United States Patent
Lee et al.

(10) Patent No.: US 9,218,984 B2
(45) Date of Patent: Dec. 22, 2015

(54) METHOD FOR MANUFACTURING A SEMICONDUCTOR DEVICE

(71) Applicant: SK hynix Inc., Icheon-si (KR)

(72) Inventors: Ki Lyoung Lee, Hwaseong-si (KR); Cheol Kyu Bok, Icheon-si (KR); Keun Do Ban, Yongin-si (KR); Jung Gun Heo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/225,329

(22) Filed: Mar. 25, 2014

(65) Prior Publication Data

US 2014/0206194 A1     Jul. 24, 2014

Related U.S. Application Data

(62) Division of application No. 12/266,459, filed on Nov. 6, 2008, now Pat. No. 8,685,627.

(30) Foreign Application Priority Data

Dec. 20, 2007 (KR) .................. 10-2007-0134549
May 28, 2008 (KR) .................. 10-2008-0049896

(51) Int. Cl.
  *G03F 7/36* (2006.01)
  *H01L 21/308* (2006.01)
  *H01L 21/033* (2006.01)

(52) U.S. Cl.
  CPC .......... *H01L 21/308* (2013.01); *H01L 21/0337* (2013.01)

(58) Field of Classification Search
  CPC ............. H01L 21/308; H01L 21/3081; H01L 21/0337
  USPC .................................. 430/316, 317
  See application file for complete search history.

(56) References Cited

U.S. PATENT DOCUMENTS

| 2002/0042196 A1 | 4/2002 | Lee |
| 2003/0117608 A1 | 6/2003 | Furukawa |
| 2003/0143828 A1 | 7/2003 | Zhou et al. |
| 2003/0232509 A1 | 12/2003 | Chung et al. |
| 2004/0180297 A1 | 9/2004 | Yoon et al. |
| 2005/0090055 A1 | 4/2005 | Lee et al. |
| 2006/0211814 A1 | 9/2006 | Nishikawa et al. |
| 2006/0216938 A1 | 9/2006 | Miyagawa et al. |
| 2009/0047788 A1 | 2/2009 | Jung |

FOREIGN PATENT DOCUMENTS

| JP | 02-111052 | 4/1990 |
| JP | H06-216084 A | 8/1994 |
| JP | 2002-203808 A | 7/2002 |
| JP | 2005-129938 A | 5/2005 |
| JP | 2006-261307 A | 9/2006 |
| JP | 2006-303500 | 11/2006 |
| JP | 2007-093798 A | 4/2007 |
| JP | 2008-512002 A | 4/2008 |
| JP | 2008-103718 A | 5/2008 |
| JP | 2008-205470 A | 9/2008 |
| JP | 2009-055022 A | 3/2009 |
| JP | 2009-060083 A | 3/2009 |
| JP | 2009-164581 A | 7/2009 |
| KR | 1020060133166 A | 12/2006 |
| KR | 100734464 B1 | 6/2007 |

*Primary Examiner* — Daborah Chacko Davis
(74) *Attorney, Agent, or Firm* — Kilpatrick Townsend & Stockton LLP

(57) ABSTRACT

A method for manufacturing a semiconductor device includes forming an etch-target layer over a semiconductor substrate having a lower structure, forming a first mask pattern over the etch-target layer, forming a spacer material layer with a uniform thickness over the etch-target layer including the first mask pattern, forming a second mask pattern on an indented region of the space material layer, and etching the etch-target layer with the first mask pattern and the second mask pattern as an etch mask to form a fine pattern.

12 Claims, 19 Drawing Sheets

(I-I')

(I-I')

(I-I')

(I-I')

METHOD FOR MANUFACTURING A SEMICONDUCTOR DEVICE

CROSS-REFERENCES TO RELATED APPLICATIONS

This application is a divisional of U.S. patent application Ser. No. 12/266,459, filed on Nov. 6, 2008, which claims priority to Korean Patent Application Numbers 10-2007-0134549 and 10-2008-0049896, filed on Dec. 20, 2007 and on May 28, 2008 respectively, which are incorporated by reference in their entirety.

BACKGROUND OF THE INVENTION

The present invention relates to a method for manufacturing a semiconductor device, and more specifically, to a method for manufacturing a semiconductor device which may increase an overlay margin in the manufacturing process for obtaining a pad layout to facilitate forming an interconnection region when a negative tone SPT method is applied.

Due to semiconductor devices becoming highly integrated, the size and pitch of patterns for forming circuits needs to be reduced. According to Rayleigh's equation, the size of a fine pattern in a semiconductor device is proportional to the wavelength of light used in the exposure process and is in inversely proportional to the size of a lens in the exposer used for the exposure process. Thus, methods for reducing the wavelength of light used in the exposure process or enlarging the size of the lens used in the exposure process have been used to form fine patterns.

Various photo processes have overcome technical limits in the manufacture of semiconductor devices. For example, masks have been finely designed to adjust the amount of light transmitted through the mask; new photoresist materials have been developed; scanners using a high numerical aperture lens have been developed; and transformed masks have been developed.

However, it is difficult to form a desired width and pitch of a pattern due to limitations of exposure and resolution capacities using currently available light sources, e.g., KrF and ArF. For instance, exposure technologies for manufacturing patterns of about 60 nm have been developed, but making patterns less than 60 nm has been problematic.

Various studies have been conducted to form photoresist patterns having a fine size and pitch.

One of those studies describes a double patterning technology (DPT) of performing double photo processes to form a pattern.

In one example of a DPT, a double exposure etch technology (DE2T) includes exposing and etching a first pattern having a double cycle, and exposing and etching a second pattern having a double cycle between the first patterns. In another example of a DPT, a spacer patterning technology (SPT) includes forming a pattern using a spacer. Both the DE2T and the SPT may be performed using a negative tone and a positive tone.

In the negative tone DE2T, a pattern obtained from a first mask process is removed in a second mask process to form a desired pattern. In the positive tone DE2T, patterns obtained from a first mask process and a second mask process are combined to form a desired pattern. However, the DE2T using two different masks requires additional processes and increases the complexity. Also, it is possible to generate mis-alignment, which is called "overlay," in the pattern obtained from the first mask process and the second mask process that are separate from each other.

On the other hand, the SPT is a self-aligned method that comprises performing a mask process once to pattern a cell region, thereby preventing mis-alignment.

However, in order to form pad patterns in core and peripheral circuit regions, particularly in outer block of cell mats, an additional mask process is required to isolate each pad patterns. Generally, while plural line-type fine patterns arranged in central block of the cell mat are formed by the SPT, the outer block of the cell mat are not patterned. After forming the plural line-type patterns in the central block, the pad patterns, each connected to each line-type fine pattern, are formed by patterning the outer block of the cell mat. While the outer block is patterned, a mask process for determining a shape of the pad patterns is performed. Then, the additional mask process for removing odds and ends in the outer block is also performed. Also, it is difficult to control deposition uniformity of a spacer forming region and regulate a critical dimension (CD) in a spacer etching process.

Although the SPT is singly applied to a NAND flash process in the case of a multi-layered structure including a line/space, it is difficult to form a pattern by using the SPT if brick wall patterns are provided in a DRAM or complicated pattern layers. In this case, the DE2T is generally used.

BRIEF SUMMARY OF THE INVENTION

Various embodiments of the present invention are directed at providing a pad layout to facilitate the formation of an interconnection region using a basic principle that a final profile of a gap fill poly formed between spacer deposition materials is formed to have a line when a negative tone SPT method is applied.

Various embodiments of the present invention are directed at increasing an overlay margin because a dry etch-back or wet removing process can be applied when the gap fill poly is removed to expose the spacer deposition material.

According to an embodiment of the present invention, a method for manufacturing a semiconductor device includes forming an etch-target layer over a semiconductor substrate having a lower structure, forming a first mask pattern over the etch-target layer, forming a spacer material layer with a uniform thickness over the etch-target layer including the first mask pattern, forming a second mask pattern on an indented region of the space material layer, and etching the etch-target layer with the first mask pattern and the second mask pattern as an etch mask to form a fine pattern.

According to an embodiment of the present invention, a method for manufacturing a semiconductor device includes: sequentially forming an etch-target layer, a first hard mask material layer, a first partition material layer, and a second hard mask material layer over a semiconductor substrate; selectively etching the second hard mask material layer to form a second hard mask pattern; etching the first partition material layer with the second hard mask pattern as an etch mask to form a first partition; forming a spacer material layer and a second partition material layer over the first hard mask material layer including the first partition; partially etching the spacer material layer and the second partition material layer until the first partition is exposed, thereby exposing the spacer material layer to form a second partition between the first partitions; etching the spacer material layer and the first hard mask material layer with the first partition and the second partition as an etch mask to form a first hard mask pattern; and etching the etch-target layer with the first hard mask pattern as an etch mask to form a fine pattern.

According to an embodiment of the present invention, a method for manufacturing a semiconductor device includes forming an etch-target layer over a semiconductor substrate having a lower structure, forming a first mask material layer over the etch-target layer and selectively etching the first mask material layer to form a first mask pattern including a pad pattern and a line pattern, forming a second mask pattern including a line pattern formed between the first mask patterns, forming a third mask pattern that connects the second mask pattern to the pad pattern of the first mask pattern, and etching the etch-target layer with the first mask pattern, the second mask pattern and the third mask pattern as an etch mask to form a fine pattern.

DESCRIPTION OF THE EMBODIMENTS

FIGS. 1a to 1h are cross-sectional diagrams illustrating a negative tone Spacer Patterning Technology (SPT). FIGS. 1a to 1h depict when a control gate of a flash memory is formed. The present invention may be used for other structures in the flash memory device or for other types of memory devices.

Figure 1A:
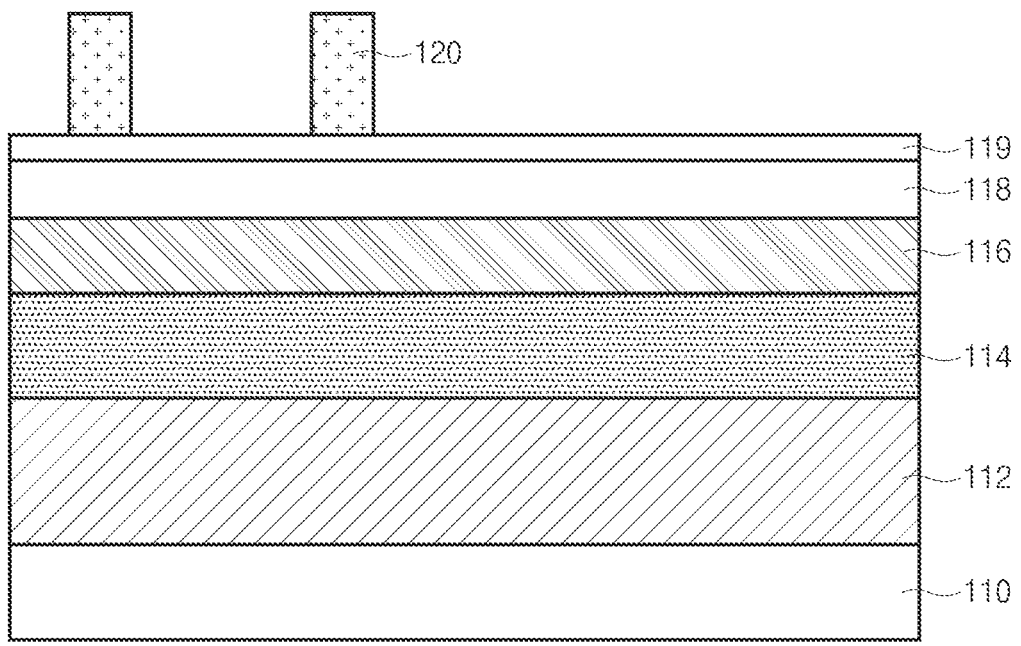
FIGS. 1a to 1h are cross-sectional diagrams illustrating a negative tone Spacer Patterning Technology (SPT).

Referring to FIG. 1a, a device isolation film (not shown) that defines an active region is formed in a semiconductor substrate 100. An oxide/nitride/oxide (ONO) dielectric layer 104 is deposited over the semiconductor substrate 100. Also, on the ONO dielectric layer 104, a gate layer 106 is deposited. Herein, the gate layer 106 includes a poly and a tungsten silicide. A first silicon nitride oxide (SiON) film 110 is formed over the gate 106. Herein, under the first SiON film 110, there are multi layers for constructing the control gate of the flash memory over the semiconductor substrate 100. But, in other embodiment, an etch-target layer under the first SiON film 110 can be any layer included in other fine patterns such as a capacitor, conductive wire, and etc.

A first Tetra Ethyl Ortho Silicate (TEOS) film 112 and a first poly film 114 are deposited over the first SiON film 110 as a hard mask.

A first amorphous carbon 116 and a second SiON film 118 are formed over the first poly film 114 as a hard mask to etch the first poly film 114. It is not easy to etch the first poly film 114 using a photoresist mask. A Bottom Anti-Reflected Coating (BARC) film 119 is formed over the second SiON film 118.

A photoresist film (not shown) is coated over the BARC film 119. An exposing and developing process is performed on the photoresist film using a mask in which a pattern having a pitch twice as wide as a desired pitch is defined to form a photoresist pattern 120. For example, when an etch bias is not considered, if a line is formed to have a critical dimension (CD) of 40 nm, a space between two neighboring lines is formed to have a CD of 120 nm. That is, the line to space ratio is 1 to 3.

Figure 1B:
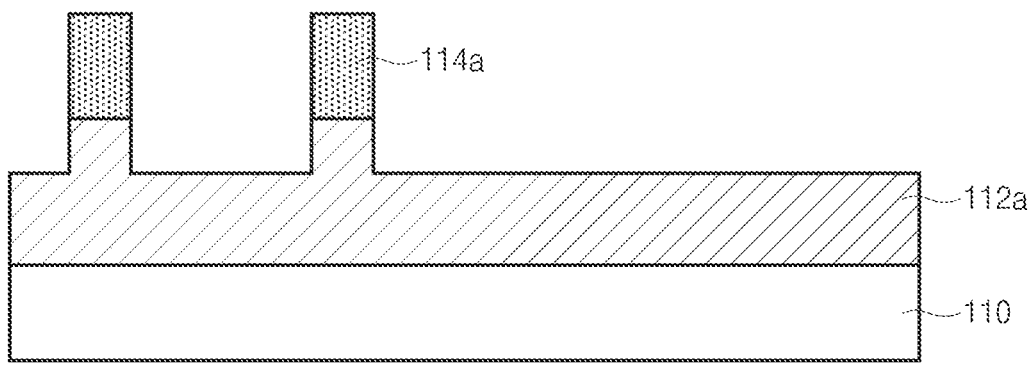

Referring to FIG. 1b, the BARC film 119, the second SiON film 118, the first amorphous carbon 116 and the first poly 114 are sequentially etched using the photoresist pattern 120 as an etch mask to form a first poly pattern including a first structure 114a of the first poly film 114 and a second structure 114b of the first poly 114. The first poly pattern includes many other structures that resemble the first and second structures. The residual photoresist pattern 120, the BARC film 119, the second SiON film 118 and the amorphous carbon 116 are then removed.

Also, an upper portion of the first TEOS 112 is partially etched based on the thickness of the spacer (described later) formed on the first TEOS 112. This reason why the upper portion is partially etched is that the height of the second poly pattern (described later), which is formed by filling up a gap between the spacer, is substantially same to the height of the first poly pattern 114a, 114b. If the heights of the first and second poly patterns are different, an etch process using both the first and second poly patterns as an etch mask is unstable because the etch mask is not uniform. This can distort an etch profile formed by the etch process. In order to prevent such distortion, the upper portion of the first TEOS 112 should be etched.

Figure 1C:
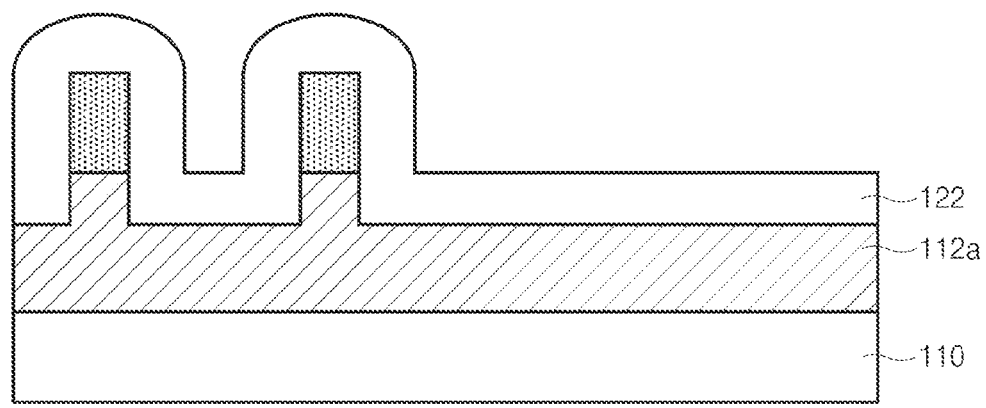

Referring to FIG. 1c, a second TEOS 122 used as the spacer is deposited over the first TEOS 112 and the first poly pattern 114a, 114b. The second TEOS 122 should be deposited at a temperature which is lower than the deposition temperature of the first poly pattern 114a, 114b and the deposition temperature of the first TEOS 112 in order to prevent a film lifting phenomenon that results from thermal stress. In addition, because a deposition material used as the spacer affects a CD of fine patterns in a semiconductor device, the second TEOS 122 is preferably formed using a material having an excellent step coverage. In one embodiment, the second TEOS 122 is formed using an Atomic Layer Deposition (ALD) process. Herein, it is critical that the second TEOS 122 is deposited with a uniform thickness, e.g., substantially same to the CD of the first poly pattern 114a, 114b.

The second TEOS 122 should conforms to the shape of the combined first TEOS 112 and first poly pattern 114a, 114b and define an indented region (or trench) 123 between the first structure 114a and the second structure 114b of the first poly pattern. The width of the trench 123 preferably should be substantially the same as the width of the first structure 114a (or second structure 114b).

Figure 1D:
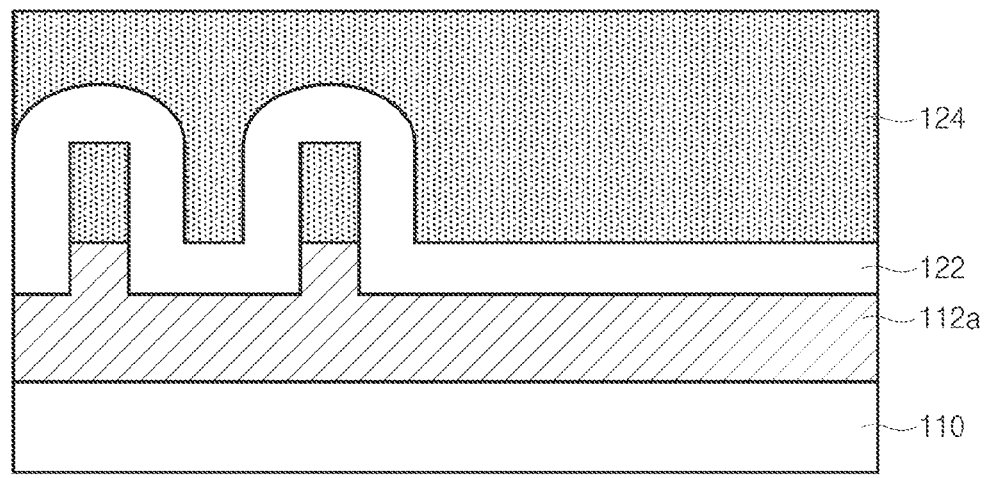
Figure 1E:
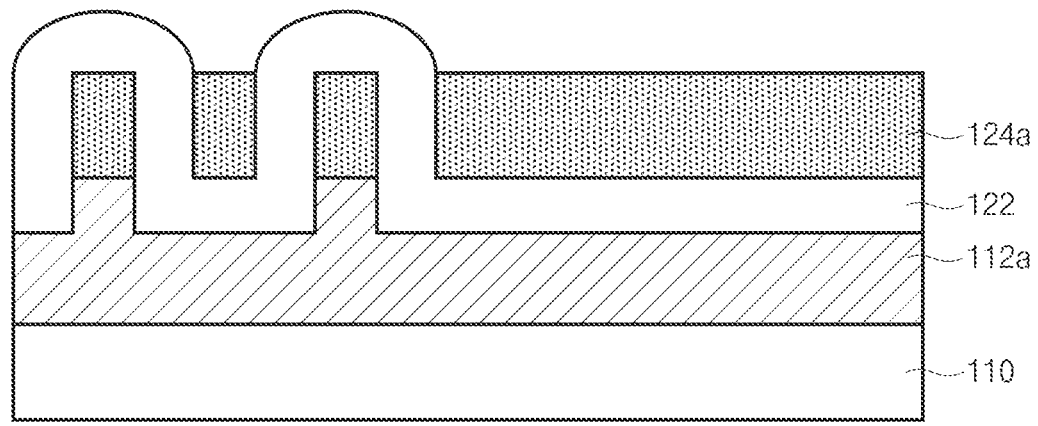

Referring to FIGS. 1d and 1e, a second poly film 124 is formed over the second TEOS 122, filling the trench 123. It is necessary to deposit enough second poly 124 to have a substantially uniform planarized surface (see FIG. 1d). An etchback process is performed on the second poly film 124 until an upper portion of the second TEOS 122 is substantially exposed. As a result, a second poly pattern including a first portion 124a of the second poly 124 and a second portion 124b of the second poly 124 is formed as shown in FIG. 1e.

Figure 1F:
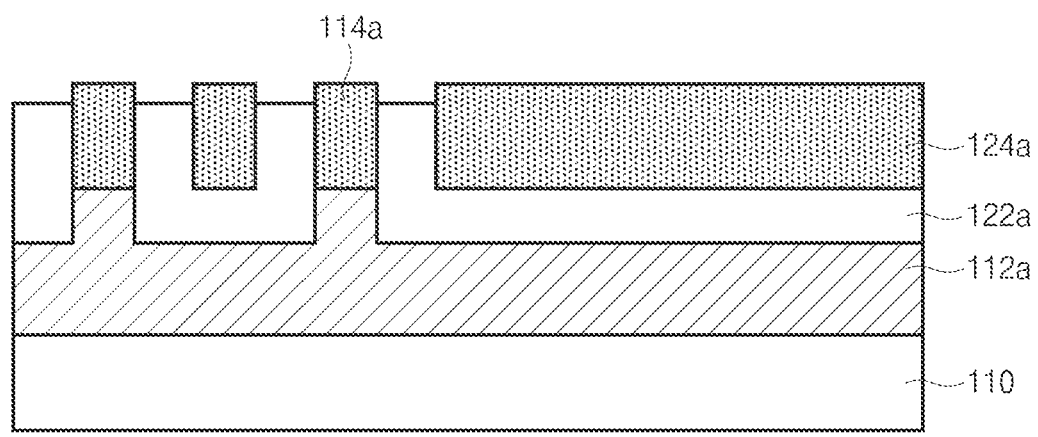

Referring to FIG. 1f, the second TEOS 122 is partially etched to expose the first poly pattern 114a, 114b so that the second portion 124b of the second poly pattern forms a line pattern with the first structure 114a and second structure 114b of the first poly pattern. The second TEOS 122 is etched using a dry etch-back process and a wet-strip process.

Figure 1G:
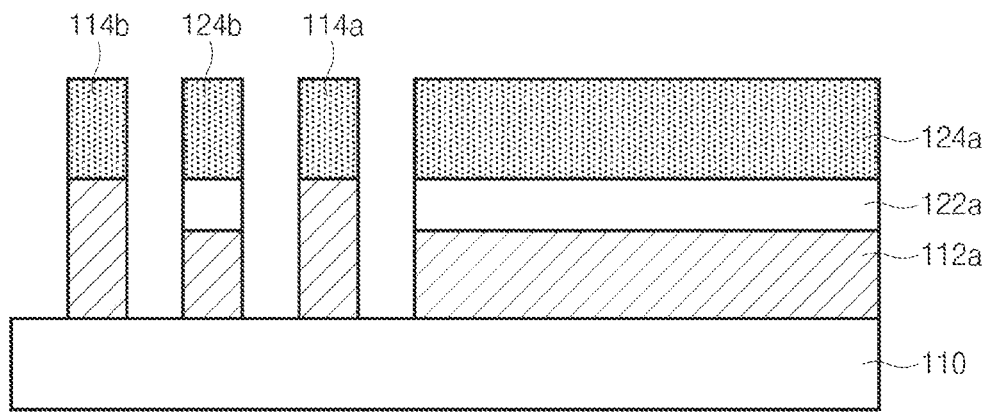

Referring to FIG. 1g, the first TEOS 112 and the second TEOS 122 are etched using the first poly pattern 114a, 114b and the second poly pattern 124a,124b, respectively, as an etch mask to form a first TEOS pattern 112a and a second TEOS pattern 122a.

Figure 1H:
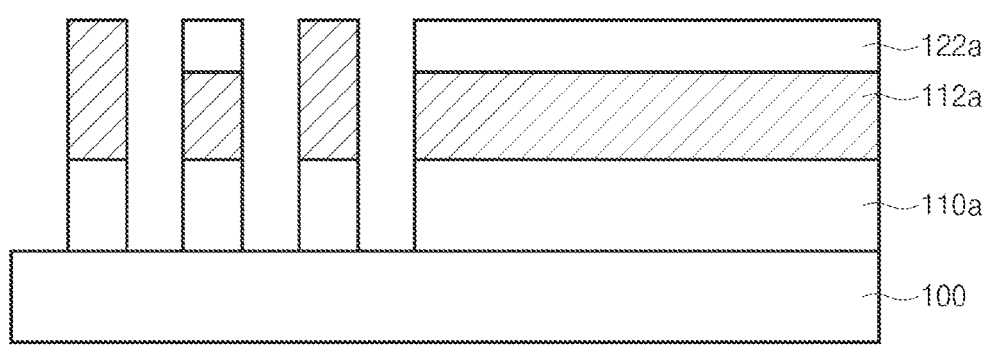

Referring to FIG. 1h, the first SiON film 110, the ONO dielectric layer 104, and the gate layer 106 are etched using the first TEOS pattern 112a and the second TEOS pattern 122a as etch masks resulting in a finely patterned first SiON film 110a having a small pitch that is difficult to form using conventional exposure processes. The patterned first SION film 110a may also be used to etch the substrate 100.

Figure 2:
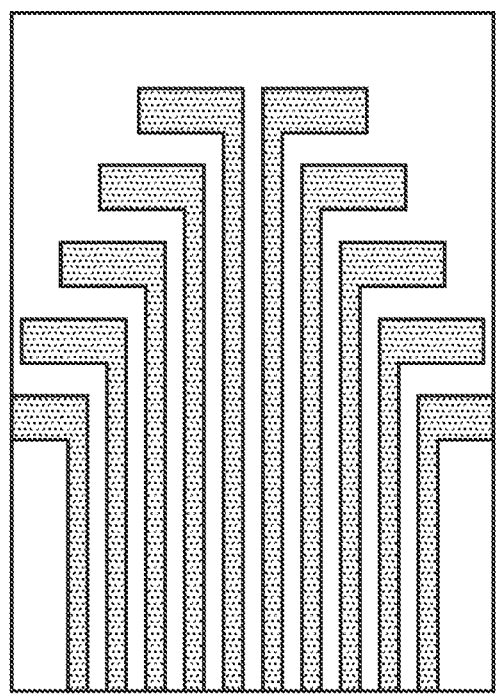
FIG. 2 is a plane diagram illustrating a cell region of a flash memory.

FIG. 2 is a plane diagram illustrating a cell region of a flash memory where the present embodiment may be implemented. Specifically, a plurality of control gates included in a cell region are formed in a pattern having the shape of a plurality of lines, and an interconnection region for connecting a source selection line or a drain selection line is formed to have the shape of a pad disposed at both ends of the control gates.

FIGS. 3a to 3g are diagrams illustrating a method for forming a fine pattern using a negative tone SPT according to an embodiment of the present invention. FIGS. 3a to 3g show fabrication of an interconnection region of the control gate of the flash memory.

Figure 3A:
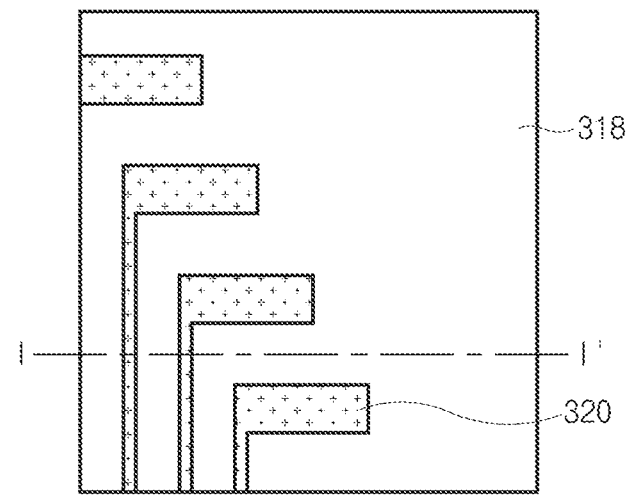
FIGS. 3a to 3g are diagrams illustrating a method for forming a fine pattern by a negative tone SPT according to an embodiment of the present invention.
Figure 3A:
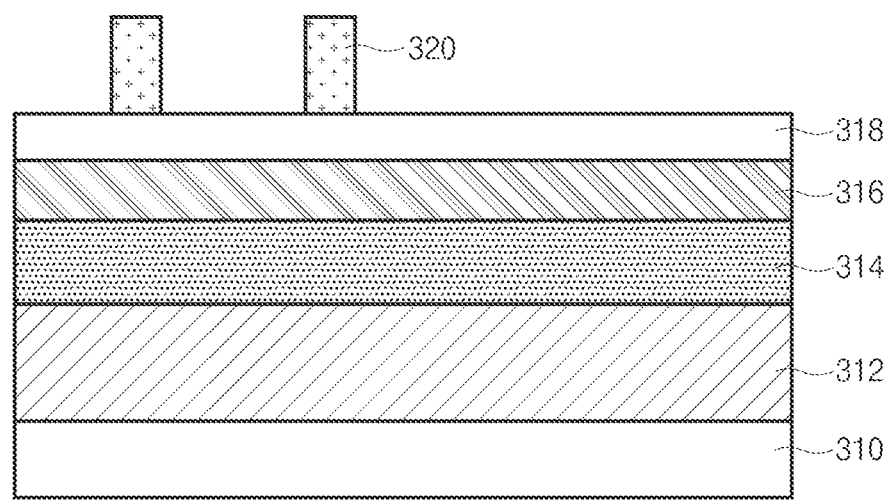

Referring to FIG. 3a, a dielectric layer 304 is deposited over a semiconductor substrate 300. Also, on the dielectric layer 304, a gate layer 306 is deposited. Herein, the gate layer 306 includes a poly and a tungsten silicide. A first silicon nitride oxide (SiON) film 310 is formed over the gate 306.

A first Tetra Ethyl Ortho Silicate (TEOS) film 312 and a first poly film 314 are deposited over the first SiON film 310 as a hard mask. A first amorphous carbon 316 and a second SiON film 318 are formed over the first poly film 314 as a hard mask to etch the firm poly film 314.

A photoresist film (not shown) is coated over the second SiON film 318. An exposing and developing process is performed on the photoresist film using a mask in which a pattern having a pitch twice as wide as a desired pitch is defined to form a photoresist pattern 320. In order to prevent the photoresist pattern 320 from being damaged by the exposing and developing process, a Bottom Anti-Reflected Coating (BARC) film (not shown) may be formed between the second SiON film 318 and the photoresist pattern 320. In such a case, the photoresist film would be coated over the BARC film.

Referring to FIG. 3a, when an etch bias is not considered, the photoresist pattern 320 formed by the exposing and developing process has a line to space of 1 to 3. For example, if the line is formed to have a CD of 40 nm, the space is formed to have a CD of 120 nm.

Figure 3B:
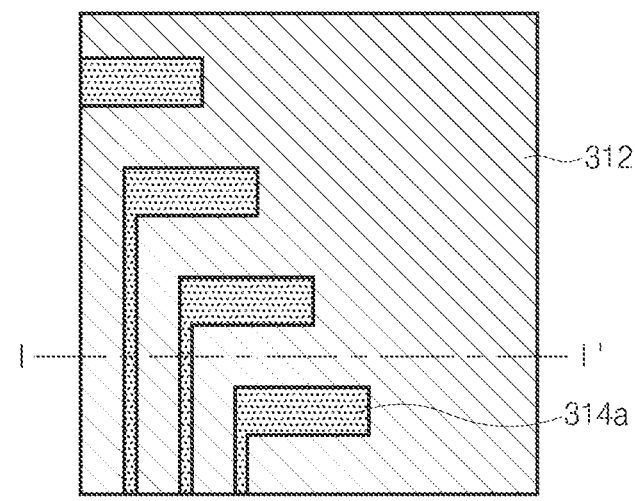
Figure 3B:
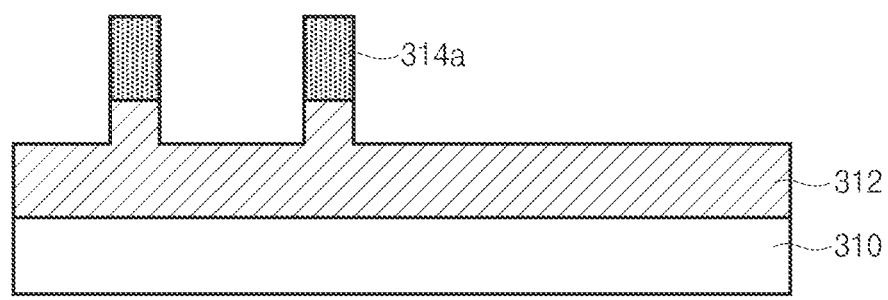

Referring to FIG. 3b, the BARC film (if present), the second SiON film 318, the first amorphous carbon 316 and the first poly 314 are sequentially etched using the photoresist pattern 320 as an etch mask to form a first poly pattern including a first structure 314a of the first poly 314 and a second structure 314b of the first poly 314. The residual photoresist pattern 320, BARC film (if present), second SiON film 318, and first amorphous carbon 316 are then removed. An upper portion of the first TEOS film 312 is partially etched based on the thickness of the spacer (described later) formed on the first TEOS 312.

Figure 3C:
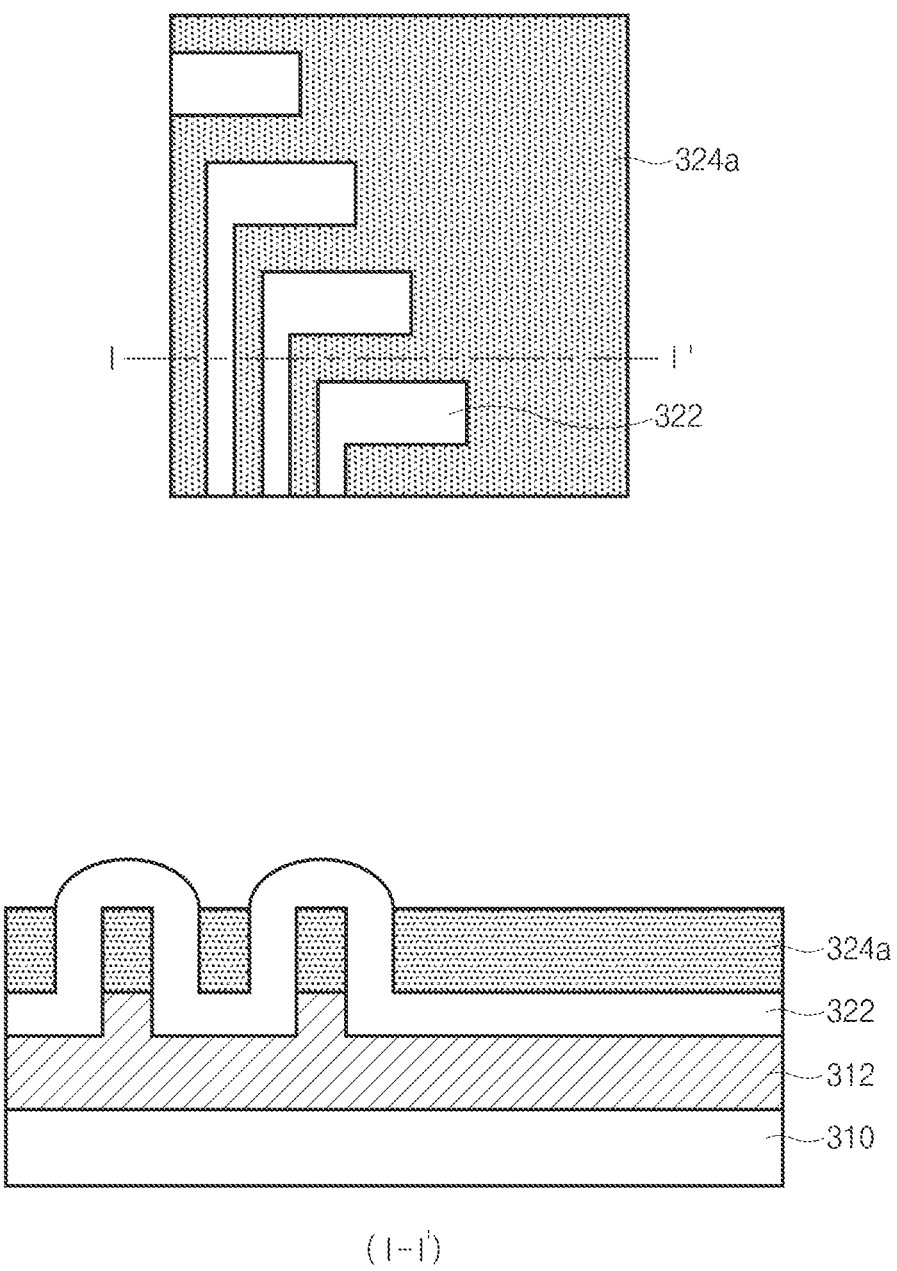

Referring to FIG. 3c, a second TEOS film 322 used as a spacer material is deposited over the first TEOS 312 and the first poly pattern 314a, 314b. The second TEOS film 322 formed over the first poly pattern 314a, 314b defines an indented region (or trench) between the first structure 314a and the second structure 314b of the first poly pattern. A second poly film 324 that is a gap fill hard mask is formed over the second TEOS film 322 and fills the indented region. The second poly film 324 is deposited to a sufficient thickness to provide a substantially uniform upper surface. An etch-back process or a Chemical Mechanical Polishing (CMP) process is performed on the second poly 324 to expose portions of the second TEOS 322. The resulting second poly has a number of regions depending on the desired number of patterned lines, interconnection regions, and the like. For example, FIG. 3c illustrates the second poly 324 including a first portion 324a, a second portion 324b, and a third portion 324c.

Figure 3D:
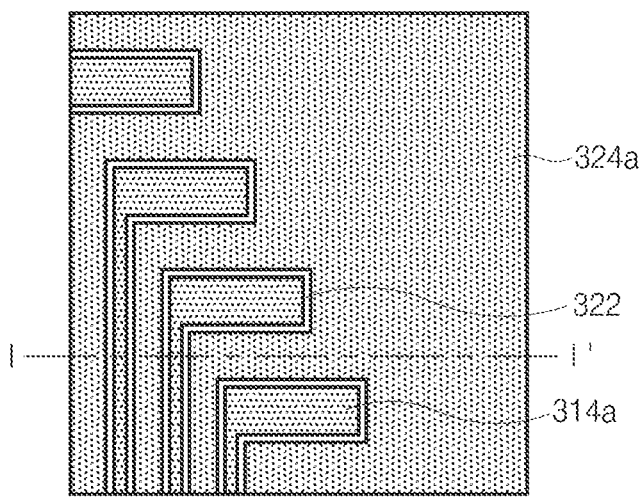
Figure 3D:
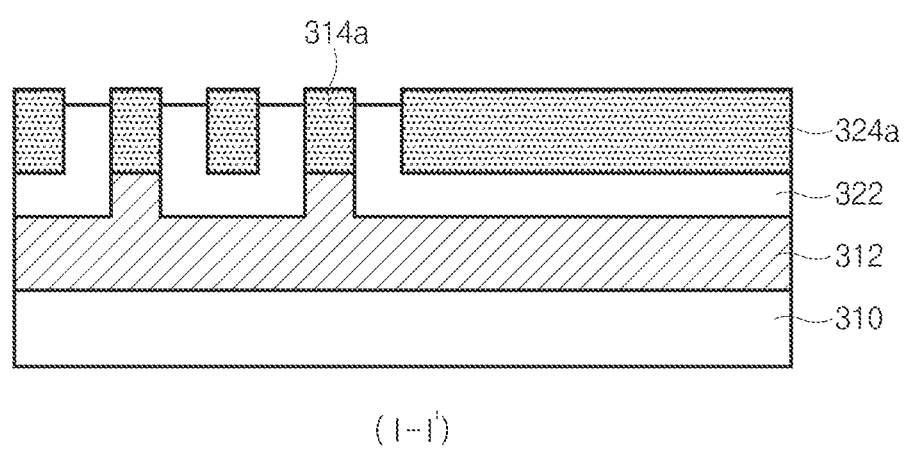

Referring to FIG. 3d, an etch-back process or a Chemical Mechanical Polishing (CMP) process is performed on the second TEOS 322. As a result, the first poly pattern 314a, 314b is exposed.

Figure 3E:
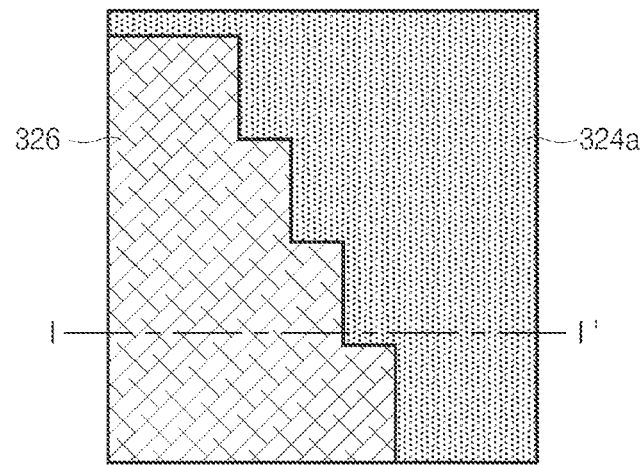
Figure 3E:
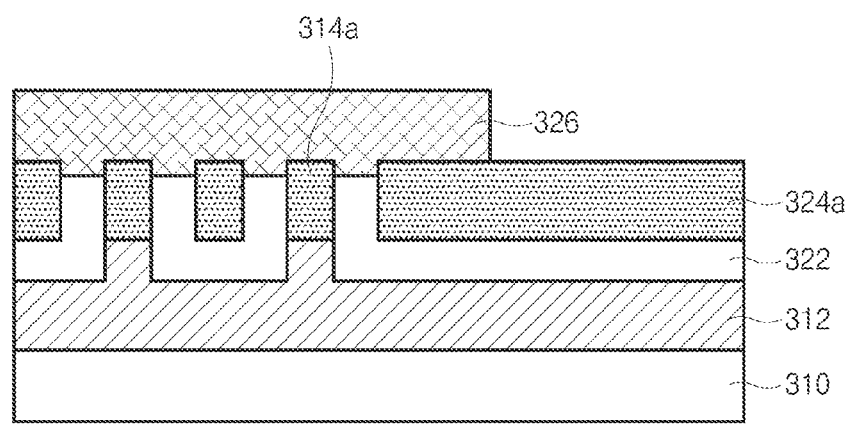

Referring to FIG. 3e, a photoresist film (not shown) is coated over the second poly pattern 324a, 324b, 324c, the first poly pattern 314a, 314b, and exposed portions of the second TEOS 322. An exposing and developing process is performed on the photoresist film to form a second photoresist pattern 326 that defines edges of the second poly pattern 324a, 324b, 324c corresponding to a desired pad shape. In order to form the second poly pattern 324a, 324b, 324c into accurate pad shapes and prevent misalignments of the desired pads, a mask process for forming the second photoresist pattern 326 must be performed with precision. In particular, the shape of the second photoresist pattern 326 is determined by a pair of pad patterns, and could be, for example, a stepped shape as illustrated in FIG. 3e. In this case, for each step: in a horizontal direction (I-I"), the second photoresist pattern 326 extends by an amount approximately equal to a width of a line pattern formed by a portion of the first poly 314 (e.g. 314a) and portions of the second TEOS 322 on either side of the portion of the first poly 314, and by a width of an adjacent portion of the second poly 324 (e.g. 324b); in a vertical direction, the second photoresist pattern 326 extends by an amount determined by the two pad patterns connected to the two line patterns—for example, the second photoresist pattern 326 could extend by an amount equal to a length of a pad pattern formed by a portion of the first poly pattern 314, a length of portions of the second TEOS 322 on either side of the portion of the first poly 314, and a length of an adjacent portion of the second poly 324.

Figure 3F:
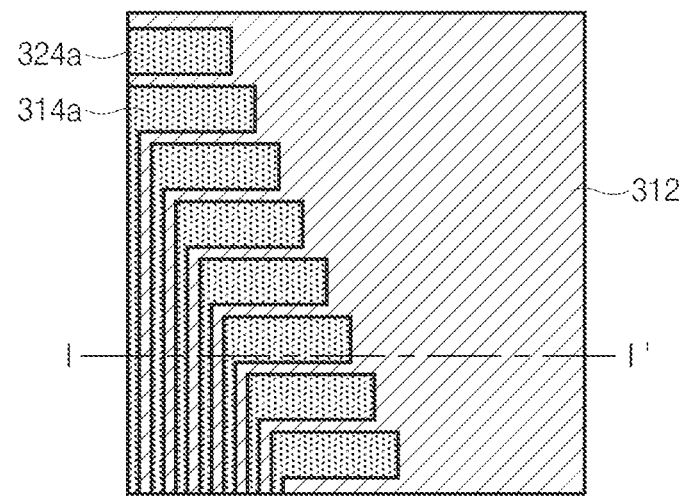
Figure 3F:
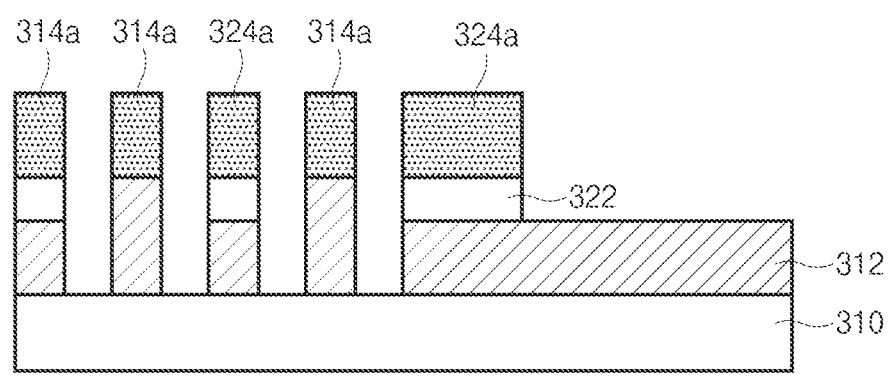

Referring to FIG. 3f, the exposed portion of the second poly pattern 324a and the corresponding portion of the second TEOS 322 are etched using the photoresist pattern 326 as an etch mask to expose the first TEOS 312. The photoresist pattern 326 is then removed.

The first TEOS 312 and the second TEOS 322 are then etched using the first poly pattern 314a and the second poly pattern 324a, respectively, as an etch mask to form a first TEOS pattern 312a and a second TEOS pattern 322a over the first SiON film 310.

Figure 3G:
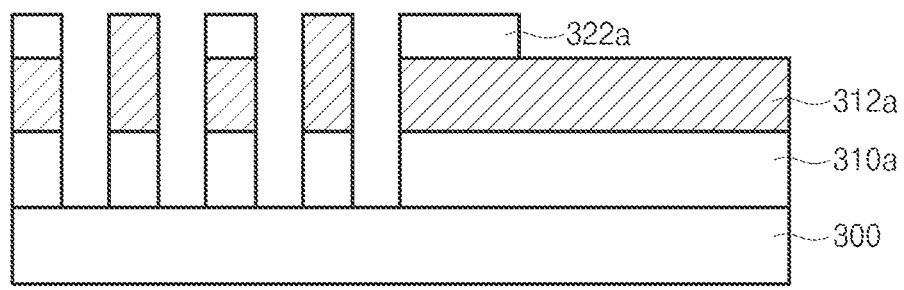

Referring to FIG. 3g, the first SiON film 310 is etched using the first TEOS pattern 312a and the second TEOS pattern 322a as etch masks resulting in a finely patterned first SiON film 310a having a small pitch that is difficult to form using conventional exposure processes.

The fine pattern shown in FIG. 2 is formed to have a plurality of unit patterns. Each unit pattern includes a line pattern corresponding to a control gate and a pad pattern corresponding to an interconnection region. In the fine pattern obtained from FIGS. 3a to 3g, the first unit pattern selected from the unit patterns is formed corresponding to the first poly pattern 314a, 314b, and the second unit pattern is formed corresponding to the second poly pattern 324a, 324b, 324c. The first unit pattern and the second unit pattern are located in an alternating manner.

In the above-described embodiment, using the second TEOS pattern 322a to form etching masks, it is possible to form a fine pattern that is difficult to obtain by using photolithography techniques with photoresist films. However, an etch margin is not large and it may challenging to from the pad shapes using the photoresist pattern 326. A pitch between pads is narrow and mis-alignment may result due to the use of the photoresist pattern 326 in an exposing process. If mis-alignment occurs, the second poly pattern 324a, 324b, 324c is not accurately etched, so that pad patterns remain connected to one another to cause defects in the device.

FIGS. 4a to 4g are diagrams illustrating a method for forming a fine pattern using a negative tone SPT according to an embodiment of the present invention.

Figure 4A:
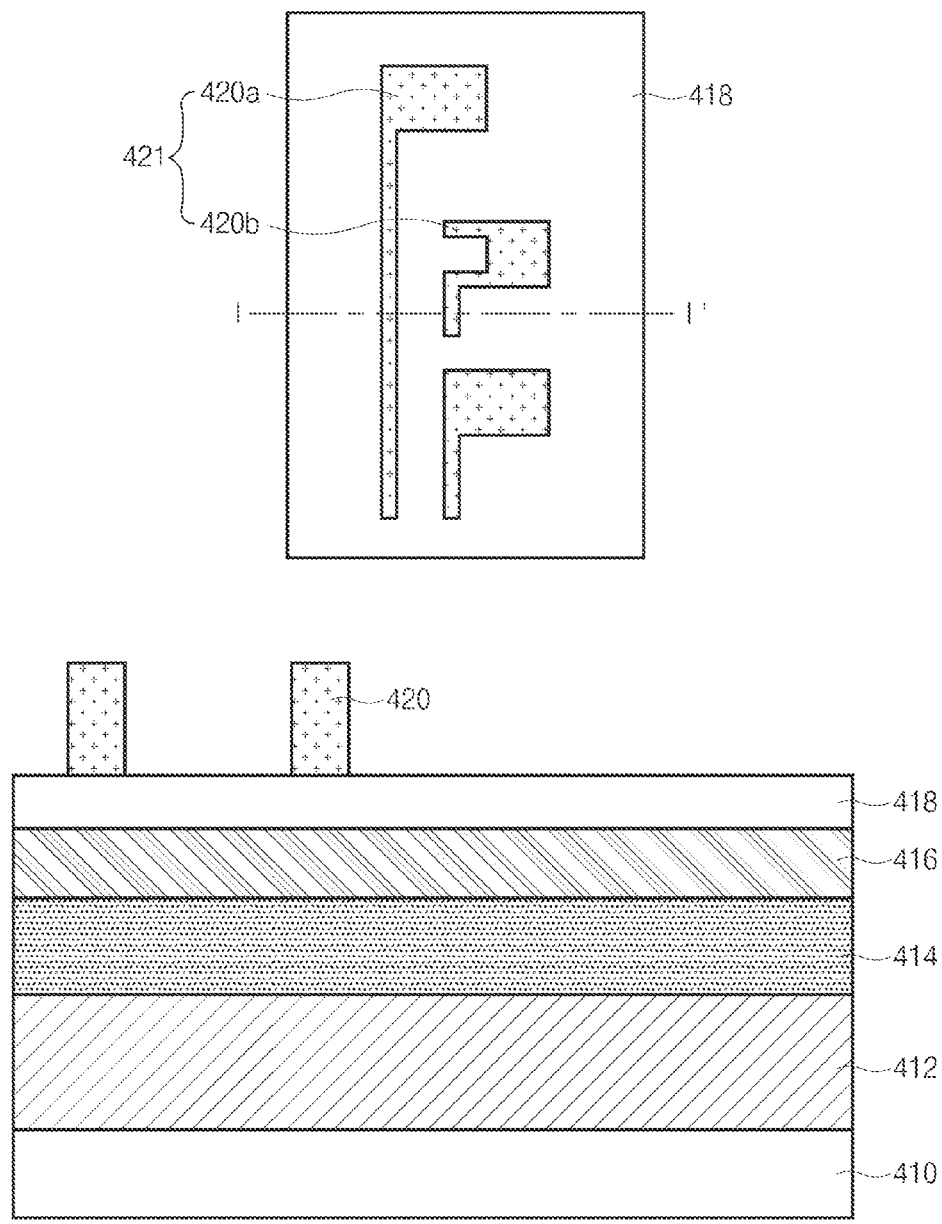
FIGS. 4a to 4g are diagrams illustrating a method for forming a fine pattern by a negative tone SPT according to an embodiment of the present invention.

Referring to FIG. 4a, a first photoresist pattern 420a, 420b having a different shape from the photoresist pattern of FIG. 3a is formed over a second silicon nitride oxide (SiON) film 418.

Referring to FIGS. 4a to 4g, a dielectric layer 404 is deposited over a semiconductor substrate 400. Also, on the dielectric layer 404, a gate layer 406 is deposited. A first silicon nitride oxide (SiON) film 410 is formed over the gate 406.

A first TEOS 412 and a first poly 414 as hard masks are formed over the first SiON film 410. A first amorphous carbon 416 is formed over the first poly 414. The first amorphous carbon 416 and the second SiON film 418 function as hard masks for etching the first poly 414. A Bottom Anti-Reflected Coating (BARC) film (not shown) may be formed between the second SiON film 418 and the first photoresist pattern 420a, 420b.

A photoresist film (not shown) is coated over the second SiON film 418 (or the BARC if present). An exposing and developing process is performed on the photoresist film using a mask in which a control gate pattern having a pitch twice as wide as a desired pitch and pad patterns disposed between the control gate patterns are defined. Through the exposing and developing process, the first photoresist pattern is formed that includes: (1) a first portion 420a having line patterns where the control gates are formed and pad patterns where an interconnection region is formed; and (2) a second portion 420b having a part of the pad patterns and no line patterns. The first photoresist pattern 420a, 420b has a line to space ratio of 1 to 3. For example, when an etch bias is not considered, if a line is formed to have a critical dimension (CD) of 40 nm, a space is formed to have a CD of 120 nm.

Figure 4B:
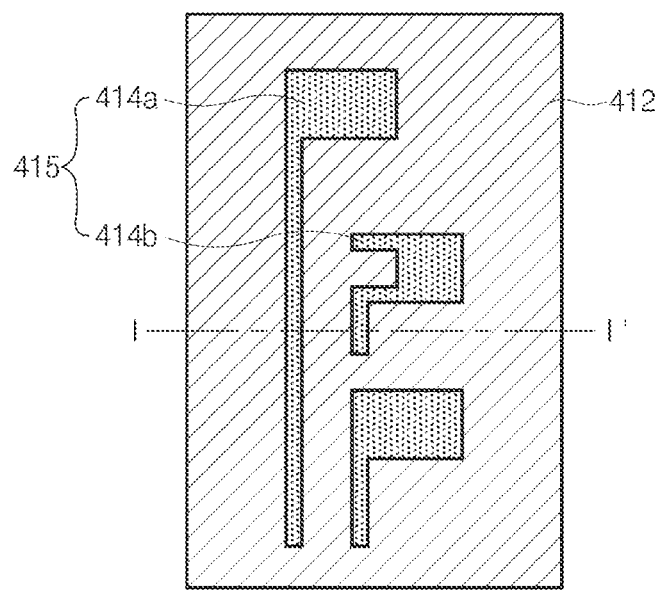
Figure 4B:
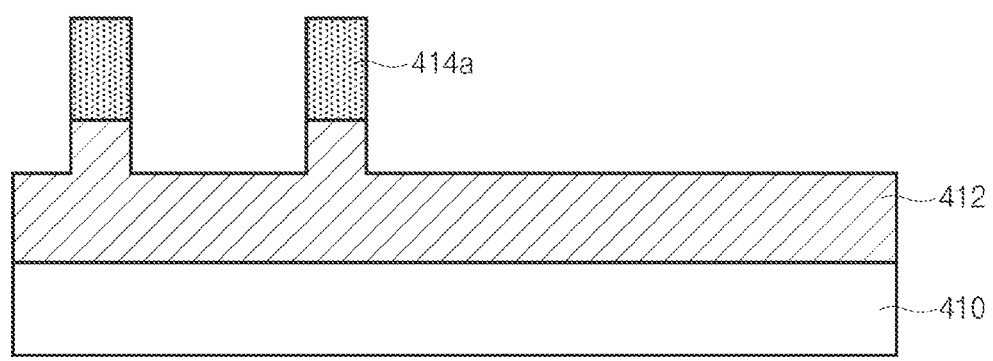

Referring to FIG. 4b, the BARC film (if present), the second SiON film 418, the first amorphous carbon 416 and the first poly 414 are sequentially etched using the first photoresist pattern 420a, 420b as an etch mask to form a first poly pattern including a first portion 414a of the first poly 414 having a first shape corresponding to the shape of the first portion 420a of the first photoresist pattern 420a, 420b (i.e. line patterns and pad patterns) and a second portion 414b of the first poly 414 having a second shape corresponding to the shape of the second portion 420b of the first photoresist pattern 420a, 420b (i.e. a part of the pad patterns and no line patterns). The residual first photoresist pattern 420a, 420b, BARC (if present), second SiON film 418 and amorphous carbon 416 are then removed. An upper portion of the first TEOS film 312 is partially etched based on the thickness of the spacer (described later) formed on the first TEOS 312.

Figure 4C:
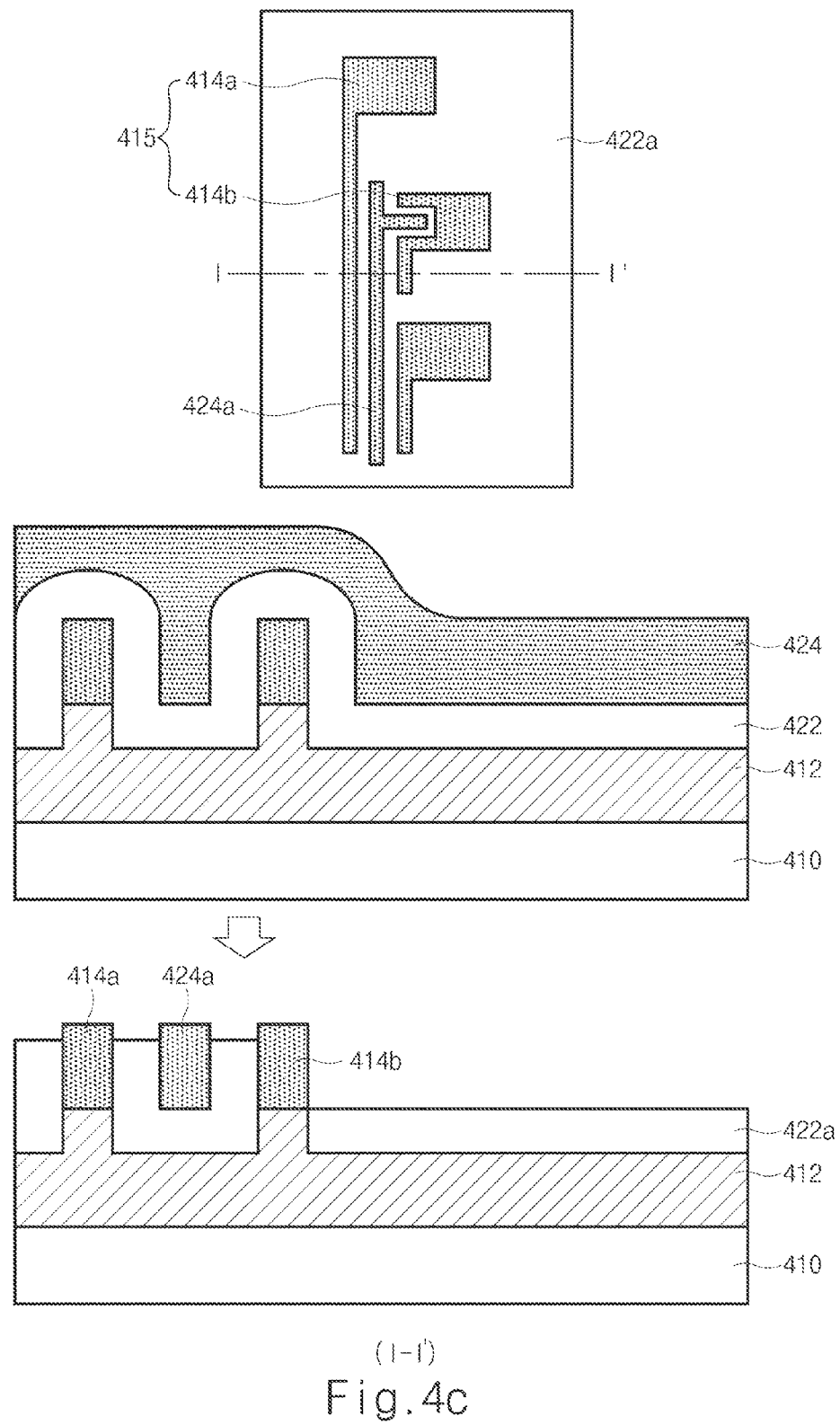

Referring to FIG. 4c, a second TEOS 422 used as a spacer material is deposited over exposed portions of the first TEOS 412 and the first poly pattern 414a, 414b. A second poly 424 that is a gap fill hard mask is formed over the second TEOS 422. Unlike the process shown in FIG. 1d for depositing the second poly sufficiently to have a planarized surface, the second poly 424 having a substantially uniform thickness is deposited over the second TEOS 422 so that the second poly 424 is formed higher in the region where the first poly pattern 414a, 414b is located than in other regions.

Figure 4D:
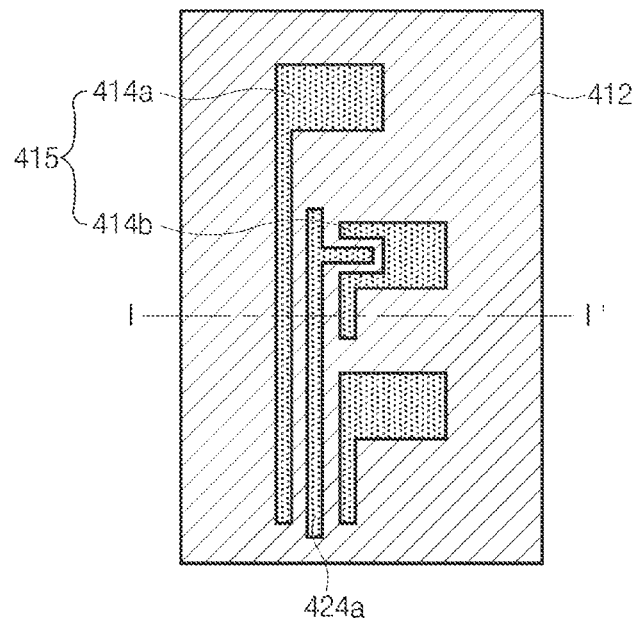
Figure 4D:
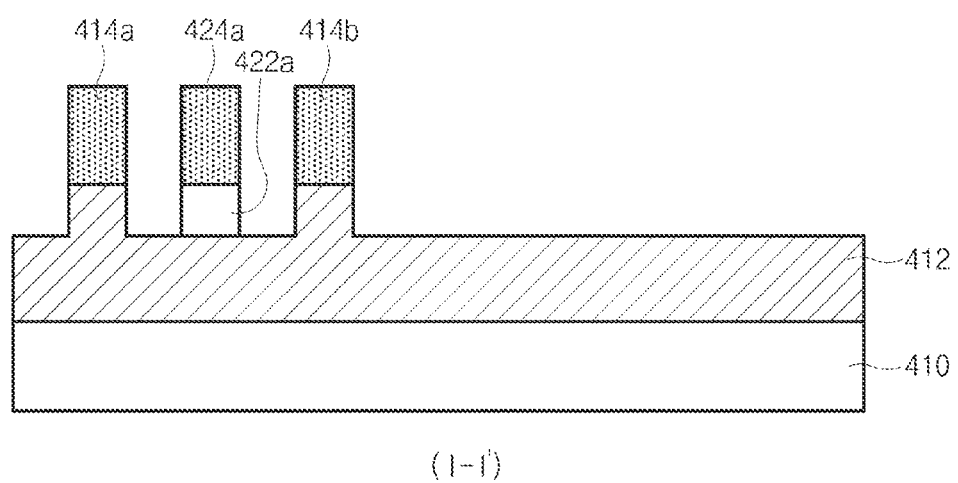

A dry etch-back process or a wet strip process is then performed on the second TEOS 422 and the second poly 424. As a result, the portion of the second poly 424 formed to have a lower height in a broad region and upper portions of the second TEOS 422 are removed substantially. But, the second poly 424 in an intended region of the second TEOS 422 between the first poly patterns 414a, 414b is remained. Further, a second poly pattern 424a including a portion of the second poly 424 having the shape of a line remains between the first portion 414a and the second portion 414b of the first poly 414 (i.e. a line pattern of the second poly pattern remains between line patterns of the first poly pattern). Referring to FIG. 4d, the second TEOS 422 is then etched so that the first poly pattern 414a, 414b and the second poly pattern 424a remain over the first TEOS 412 and so that a second TEOS pattern 422a remains under the second poly pattern 424a.

Figure 4E:
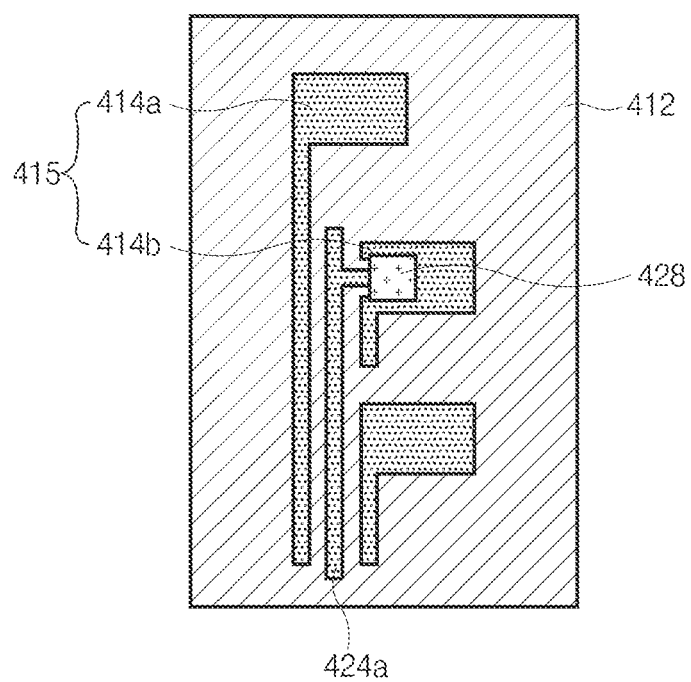

Referring to FIG. 4e, a second photoresist pattern 428 is formed in a region for interconnecting the second poly pattern 424a with the second portion 414b of the first poly 414 (i.e. interconnecting the line pattern of the second poly pattern with the part of the pad pattern of the first poly pattern). Generally, the second poly pattern 424a is connected to the second portion 414b of the first poly 414 using a second mask process. A pattern overlaying degree is required to be less than 10 nm because an SPT process for a device of design rules is performed to overcome developing limits of conventional equipment.

The second photoresist pattern 428 formed through the second mask process is similar to the second photoresist patterns 326 shown in FIG. 3e; however, process margin for forming the second photoresist pattern 428 is more sufficient. For example, the size of the second photoresist pattern 428 can be ranged from a minimum contact between the second poly pattern 424a and the second portion 414b of the first poly 414 to a size including the second poly pattern 424a and the second portion 414b of the first poly 414. That is, the second photoresist pattern 428 has a necessary condition for the minimum contact and a sufficient condition for separate the interconnected area from a neighboring pattern, i.e., the first portion 414a of the first poly 414. In addition, if the second photoresist pattern 428 has a proper size in above described range, alignment margin of the second mask process can be improved. Thus, the second photoresist pattern 428 has more advantages than the second photoresist patterns 326 which should be formed by performing the exposing and developing process accurately.

Figure 4F:
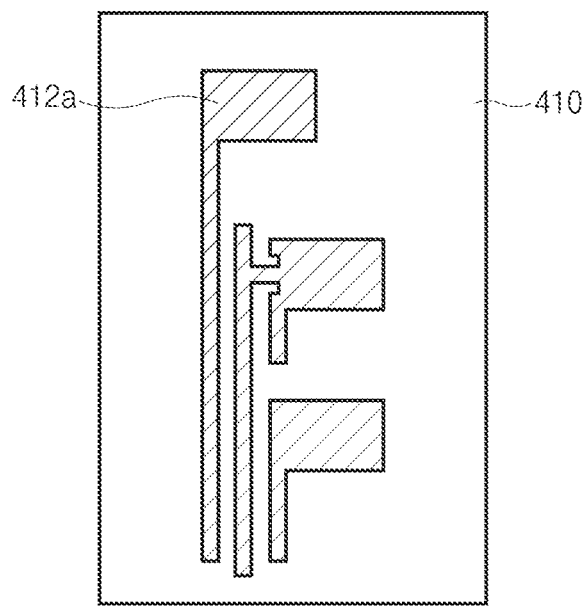

Referring to FIG. 4f, the first TEOS 412 is etched using the first poly pattern 414a, 414b, the second poly pattern 424a and the second photoresist pattern 428 as etching masks to form a first TEOS pattern 412a. The first poly pattern 414a, 414b, the second poly pattern 424a, and the second photoresist pattern 428 are then removed to expose the first TEOS pattern 412a and the first SiON film 410.

Figure 4G:
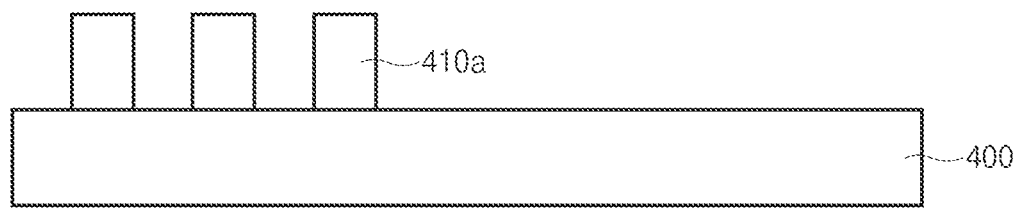

Referring to FIG. 4g, the first SiON film 410 is etched using the first TEOS pattern 412a as an etch mask resulting in a finely patterned first SiON film 410a having a small pitch which cannot be formed using conventional exposure processes. The fine pattern is formed to have a plurality of unit patterns. Each unit pattern includes a line pattern corresponding to a control gate and a pad pattern corresponding to an interconnection region. Referring to FIGS. 4a to 4f, the unit pattern includes: pad patterns of first unit patterns and second unit patterns corresponding to the first poly pattern 414a, 414b; line patterns of the first unit patterns corresponding to the first poly pattern 414a, 414b; and line patterns of the second unit patterns corresponding to the second poly pattern 424a. The pad pattern and the line pattern of the second unit pattern are connected to each other by an etching process using the second photoresist pattern 428.

In the embodiment shown in FIGS. 4a to 4g, the second poly pattern 424a disposed between portions of the second TEOS pattern 422a is formed to have the shape of a line using an etching process. Using this principle, the second poly pattern 424a and the first portion 414a of the first poly 414 are connected with the second photoresist pattern 428 so that the second poly pattern 424a and the first portion 414a of the first poly 414 may be used as an etch mask for etching the first TEOS 412 and consequently the first SiON film 410.

In comparison to the embodiment shown in FIGS. 3a to 3g for forming a plurality of fine patterns each including a control gate pattern and an interconnection region, the embodiment shown in FIGS. 4a to 4g can increase an overlay margin of the fine pattern disposed between the fine patterns in the manufacturing process using the photoresist pattern where the interconnection region is only patterned using the exposing process. In other words, it is easier to secure a larger operating margin by the etching process using the second photoresist pattern 428 shown in FIG. 4e rather than by the etching process using the photoresist pattern 326 to define the accurate boundary of pad regions of the fine patterns shown in FIG. 3e.

Particularly, the first portion 414a of the first poly 414 is formed to have a "⊃" shape, thereby increasing an overlay margin in the process for forming a pad using the second mask process. A pattern having a "⌈" shape is attached beside the first portion 414a to be connected with the first portion 414a and the second TEOS pattern 422a. As a result, a line pattern is obtained which includes the second poly pattern 424a having a "⊢" shape where the second poly 424 is etched in a subsequent etch-back or wet removing process.

As described above, the present invention provides a pad layout to facilitate the formation of an interconnection region using a basic principle that a final profile of a gap fill poly formed between spacer deposition materials is formed to have a line when a negative tone SPT method is applied.

Also, the present invention increases an overlay margin because a dry etch-back or wet removing process can be applied when the gap fill poly is removed to expose the spacer deposition material.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
   sequentially forming an etch-target layer, a first hard mask material layer, a first partition material layer, and a second hard mask material layer over a semiconductor substrate;
   selectively etching the second hard mask material layer to form a second hard mask pattern;
   etching the first partition material layer using the second hard mask pattern as an etch mask to form a first partition having first and second patterns;
   removing the second hard mask pattern;
   partially etching the first hard mask material using the first and second patterns of the first partition as an etch mask to remove a portion of the first hard mask material;
   forming a spacer material layer and a second partition material layer over the partially etched first hard mask material layer and over the first and second patterns of the first partition;
   partially etching the spacer material layer and the second partition material layer until the first pattern of the first partition and the second pattern of the first partition material layer are exposed, thereby partially exposing the spacer material layer and forming a second partition provided between the first pattern of the first partition and the second pattern of the first partition;
   etching the partially etched spacer material layer and the partially etched first hard mask material layer using the exposed first and second patterns of the first partition and the second partition as an etch mask to form a first hard mask pattern; and
   etching the etch-target layer using the first hard mask pattern as an etch mask to form an etch-target layer having a desired pattern.

2. The method according to claim 1, wherein the first partition includes a line pattern having a ratio of line area to the area of the space between the lines of about 1 to 3, the method further comprising:
   forming a silicon nitride oxide film over the second hard mask pattern material layer.

3. The method according to claim 2, further comprising forming a bottom anti-reflected coating (BARC) film over the silicon nitride oxide film.

4. The method according to claim 1, wherein the second hard mask material layer includes amorphous carbon.

5. The method according to claim 1, wherein the first hard mask material layer and the spacer material layer include the same material.

6. The method according to claim 5, wherein the first hard mask is etched to a depth which is substantially the same as a thickness of the spacer material layer.

7. The method according to claim 5, wherein the first hard mask material layer and the spacer material layer include TEOS.

8. The method according to claim 1, wherein the first partition material layer and the second partition material layer include the same material.

9. The method according to claim 8, wherein the first partition material layer and the second partition material layer include polysilicon.

10. The method according to claim 1, wherein the second partition material layer is formed to have a substantially uniform thickness, wherein the second partition is formed by partially etching a given depth of the second partition material layer.

11. The method according to claim 10, wherein the spacer material layer and the second partition material layer are partially etched by a dry etch-back process, a wet etch process or a CMP process.

12. The method according to claim 1, wherein when the second partition material layer is formed to have a substantially planarized surface, wherein the first partition and the second partition have substantially the same pitch.

* * * * *